(12) United States Patent
Hsiao

(10) Patent No.: US 10,066,288 B2
(45) Date of Patent: Sep. 4, 2018

(54) EVAPORATION APPARATUS AND EVAPORATION METHOD

(71) Applicant: AU Optronics Corporation, Hsin-Chu (TW)

(72) Inventor: Chih-Hung Hsiao, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 156 days.

(21) Appl. No.: 15/054,740

(22) Filed: Feb. 26, 2016

(65) Prior Publication Data
US 2017/0167011 A1    Jun. 15, 2017

(30) Foreign Application Priority Data
Dec. 9, 2015   (SG) .............................. 10201510101X

(51) Int. Cl.
| C23C 16/00 | (2006.01) |
| C23C 14/24 | (2006.01) |
| C23C 14/54 | (2006.01) |

(52) U.S. Cl.
CPC ............ *C23C 14/24* (2013.01); *C23C 14/544* (2013.01)

(58) Field of Classification Search
CPC ..................................................... C23C 14/24
USPC ......................................................... 118/726
See application file for complete search history.

(56) References Cited

U.S. PATENT DOCUMENTS

| 2001/0008121 A1* | 7/2001 | Tanabe .................... C23C 14/12 118/663 |
| 2003/0140858 A1 | 7/2003 | Marcus |
| 2007/0110892 A1* | 5/2007 | Awata ..................... C23C 14/16 427/8 |
| 2007/0125303 A1* | 6/2007 | Ruby .................. C23C 14/0021 118/724 |
| 2010/0139564 A1* | 6/2010 | Lee ........................ C23C 14/243 118/726 |
| 2012/0114839 A1* | 5/2012 | Fukuda ................... C23C 14/24 427/9 |
| 2014/0238105 A1* | 8/2014 | Sou ......................... H01L 51/56 73/23.2 |

FOREIGN PATENT DOCUMENTS

| JP | 2003-328115 | * 11/2003 | ............ C23C 14/24 |
| JP | 2007224354 | * 9/2007 | ............ C23C 14/24 |

(Continued)

OTHER PUBLICATIONS

English translation JP 2007224354, Sep. 2007, Ikuta (Year: 2007).*

(Continued)

*Primary Examiner* — Keath T Chen
(74) *Attorney, Agent, or Firm* — WPAT, PC

(57) ABSTRACT

An evaporation apparatus includes a holder, a source, a first sensor, a calculating unit, and an actuator. The holder is configured to hold a substrate. The source is configured to evaporate an evaporation material to be deposited on the substrate. The first sensor is configured to detect evaporation rates of the evaporation material at plural detection positions. The calculating unit is configured to estimate an evaporation angle based on the detected evaporation rates of the evaporation material at the detection positions. The actuator is configured to move the source based on the estimated evaporation angle.

24 Claims, 7 Drawing Sheets

(56) References Cited

FOREIGN PATENT DOCUMENTS

| | | |
|---|---|---|
| JP | 2007224354 A | 9/2007 |
| JP | 2009299158 A | 12/2009 |
| TW | 201241207 | 10/2012 |
| TW | M491672 | 12/2014 |

OTHER PUBLICATIONS

J. A. Dobrowolski ("Measurements of angular evaporation characteristics of sources", J. Vac. Sci. Technol. A 1 (3), Jul.-Sep. 1983, p. 1403-1408) (Year: 1983).*

* cited by examiner

EVAPORATION APPARATUS AND EVAPORATION METHOD

RELATED APPLICATIONS

This application claims priority to Singapore Application Serial Number 10201510101X, filed Dec. 9, 2015, which is herein incorporated by reference.

BACKGROUND

Technical Field

The present disclosure relates to an evaporation apparatus and an evaporation method.

Description of Related Art

An organic light-emitting device, also referred to as an organic electroluminescent device, can be constructed by sandwiching at least one organic layer between two electrodes. Organic materials are evaporated onto a substrate with an anode thereon, and then a cathode is deposited as an electrode over an uppermost one of the organic layers. The thickness of the organic layers, and layer configurations affect the light-emitting efficiency of the organic light-emitting device.

In order to provide an organic light-emitting device with uniform thickness of organic layers, the formation of the organic layers of the organic light-emitting device must be monitored or controlled.

SUMMARY

According to some embodiments of the present disclosure, an evaporation apparatus includes a holder, a source, a first sensor, a calculating unit, and an actuator. The holder is configured to hold a substrate. The source is configured to evaporate an evaporation material which is to be deposited on the substrate. The first sensor is configured to detect evaporation rates of the evaporation material at plural detection positions. The calculating unit is configured to estimate an evaporation angle based on the detected evaporation rates of the evaporation material at the detection positions. The actuator is configured to move the source based on the estimated evaporation angle.

According to some embodiments of the present disclosure, an evaporation method includes the following steps. An evaporation material is evaporated on a substrate by a source. Evaporation rates of the evaporation material are detected at plural detection positions. An evaporation angle is estimated based on the detected evaporation rates of the evaporation material at the detection positions. The source is moved based on the estimated evaporation angle.

DETAILED DESCRIPTION

Figure 1A:
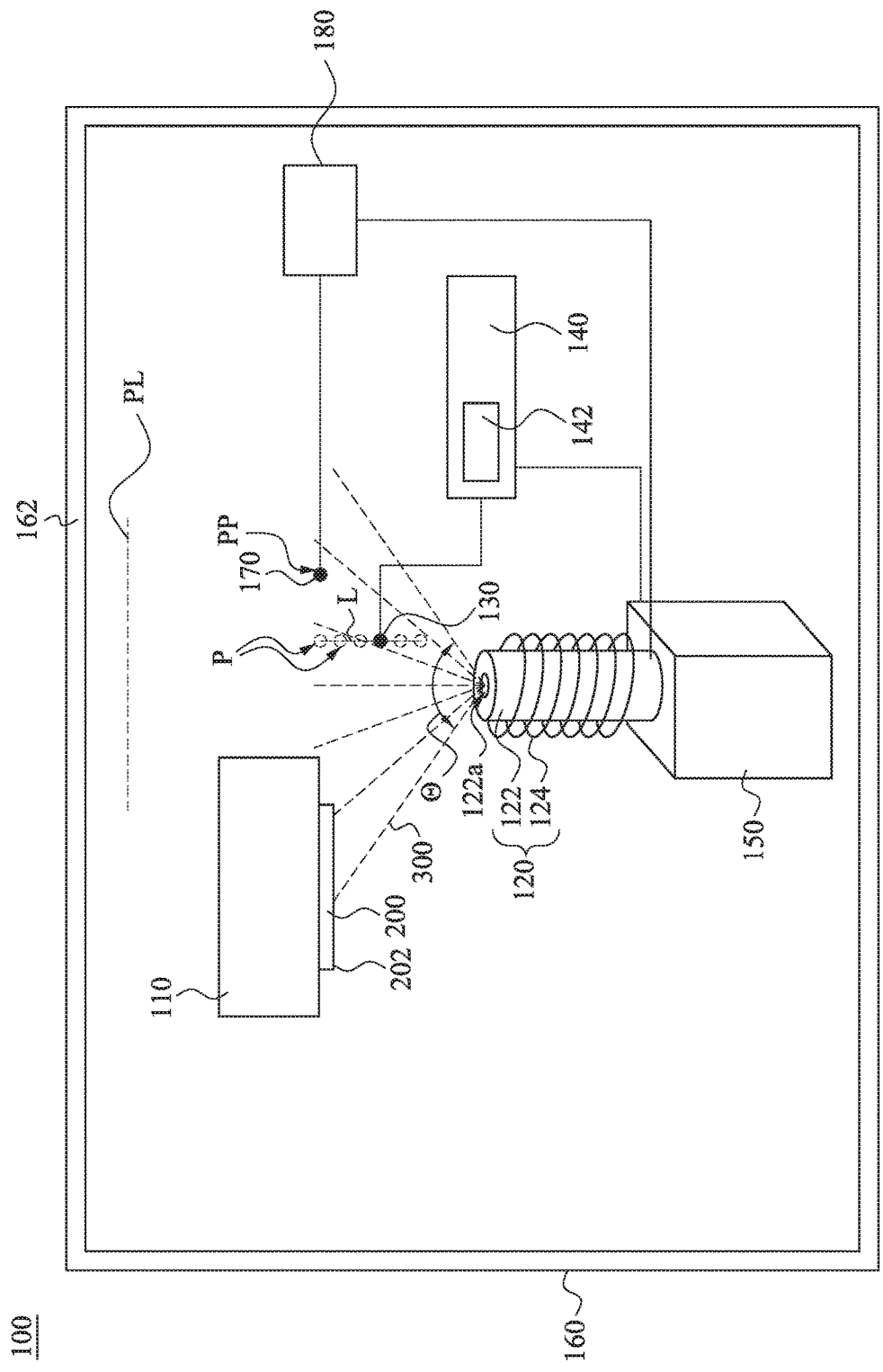
FIG. 1A is a schematic view of an evaporation apparatus according to a first embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1A is a schematic view of an evaporation apparatus 100 according to a first embodiment of this disclosure. The evaporation apparatus 100 includes a holder 110, a source 120, a first sensor 130, a calculating unit 140, and an actuator 150. The holder 110 is configured to hold a substrate 200. The source 120 is configured to evaporate an evaporation material 300 which is to be deposited on the substrate 200. The first sensor 130 is configured to detect evaporation rates of the evaporation material 300 at plural detection positions P, which are depicted as dashed circles herein. The calculating unit 140 is configured to estimate an evaporation angle $\ominus$ based on the detected evaporation rates of the evaporation material 300 at the detection positions P. The actuator 150 is configured to move the source 120 based on the estimated evaporation angle $\ominus$.

In one or more embodiments, the source 120 includes a crucible 122 and a heater 124. The evaporation material 300 is held in the crucible 122 before being evaporated. The heater 124 surrounds the crucible 122 for heating the crucible 122. The crucible 122 has an opening 122a from which the evaporation material 300 is discharged. In some embodiments, the evaporation material 300 may be organic material, but it should not limit the scope of the present disclosure.

In one or more embodiments, the evaporation material 300 discharged from the opening 122a of the crucible 122 may spread at the evaporation angle $\ominus$. For example, the evaporation angle $\ominus$ may be in a range from 50 degrees to 100 degrees. However, various factors may change the evaporation angle $\ominus$. For example, a residue of the evaporation material 300 may be accumulated in or around the opening 122a and slightly clog the path for discharging the evaporation material 300. In some situations, shutting down and restarting the production line, which may include breaking the vacuum, may also change the evaporation angle $\ominus$. The change of the evaporation angle $\ominus$ has a great impact on the distribution of the evaporation rates, such that the substrate 200 may receive too much evaporation material 300 or receive the evaporation material 300 unevenly.

In one ore more embodiments, the evaporation angle Θ is estimated based on plural detected evaporation rates, and the source 120 is moved according to the estimated evaporation angle Θ. In some embodiments, the source 120 is movable along a direction substantially orthogonal to a surface 202 of the substrate 200 on which the evaporation material is to be deposited. Alternatively, in some embodiments, the source 120 is movable along a direction substantially parallel with the surface 202 of the substrate 200 on which the evaporation material is to be deposited (referring to FIG. 3A). In this way, although the evaporation angle Θ may be changed, the film thickness uniformity of the evaporation material on the substrate 200 can substantially be maintained.

In one or more embodiments, the evaporation apparatus 100 further includes a chamber 160. The chamber 160 is configured to accommodate the holder 110, the source 120, and the first sensor 130. The holder 110 is proximate to a wall 162 of the chamber 160. The detection positions P are located between the source 120 and the wall 162 of the chamber 160, such that the first sensor 130 may receive the evaporation material 300. Herein, a line connecting the detection positions P in a sequence is defined as a detection line L, indicated as a dashed line in FIG. 1. That is, plural detection positions P are arranged along the detection line L.

In one or more embodiments, the first sensor 130 may be a mass-loaded sensor, such as crystal mass-sensors. For example, the first sensor 130 may be part of an oscillator circuit, which oscillates at a frequency approximately inversely proportional to a mass-loading, such that a signal proportional to a rate of mass-loading is generated. Herein, the first sensor 130 may be moved along the detection line L for detecting the evaporation rates of the evaporation material 300 at the respective detection positions P, but the scope of the present disclosure is not limited thereto. In some embodiments, the first sensor 130 may include plural immovable mass-loaded sensors disposed along the detection line L for receiving and detecting the evaporation material 300 at the detection positions P.

In one or more embodiments, as shown in FIG. 1A, the detection line L may be straight and substantially orthogonal to the surface 202 of the substrate 200, in which the surface 202 is configured to receive the evaporation material 300. Herein, a projection of the vertical detection line L on a projection plane PL (which is substantially parallel with the surface 202 of the substrate 200) is separated from a projection of the opening 122a of the source 120 on the projection plane PL, such that the first sensor 130 may receives the evaporation material 300 discharged at different directions. If the projection of the vertical detection line L on the projection plane PL is overlapped with the projection of the opening 122a on the projection plane PL, the evaporation material 300 received by the first sensor 130 is substantially discharged at the same direction, and therefore the evaporation rates detected by the first sensor 130 provide little information of evaporation angle Θ. To be specific, the evaporation material 300 discharged at nearly zero degree is received by the first sensor 130, and the little information of evaporation angle Θ may make the following estimation of the evaporation angle Θ more difficult.

The detection line L should not be limited to be straight and substantially orthogonal to the surface 202 of the substrate 200. In various embodiments of the present disclosure, the detection line L may be substantially parallel with the surface 202 of the substrate 200 or slopes relative to a normal direction orthogonal to the surface 202 of the substrate 200. Further, in some embodiments, the detection line L may be curved. Some of them are illustrated in the following embodiments.

In one or more embodiments, the evaporation apparatus 100 further includes a second sensor 170 and a controlling unit 180. The second sensor 170 is configured to detect a monitoring evaporation rate of the evaporation material at a predetermined position PP. In one or more embodiments, the second sensor 170 may be fixed at the predetermined position PP. Herein, the second sensor 170 may be mass-loaded sensor that capable of detecting the evaporation rates, as described in the description about the first sensor 130.

The controlling unit 180 is configured to control a temperature of the source 120 based on the monitoring evaporation rate. In this way, when the temperature of the source 120 is influenced by environmental factors or other factors, the controlling unit 180 may assist to maintain the temperature of the source 120.

Figure 2:
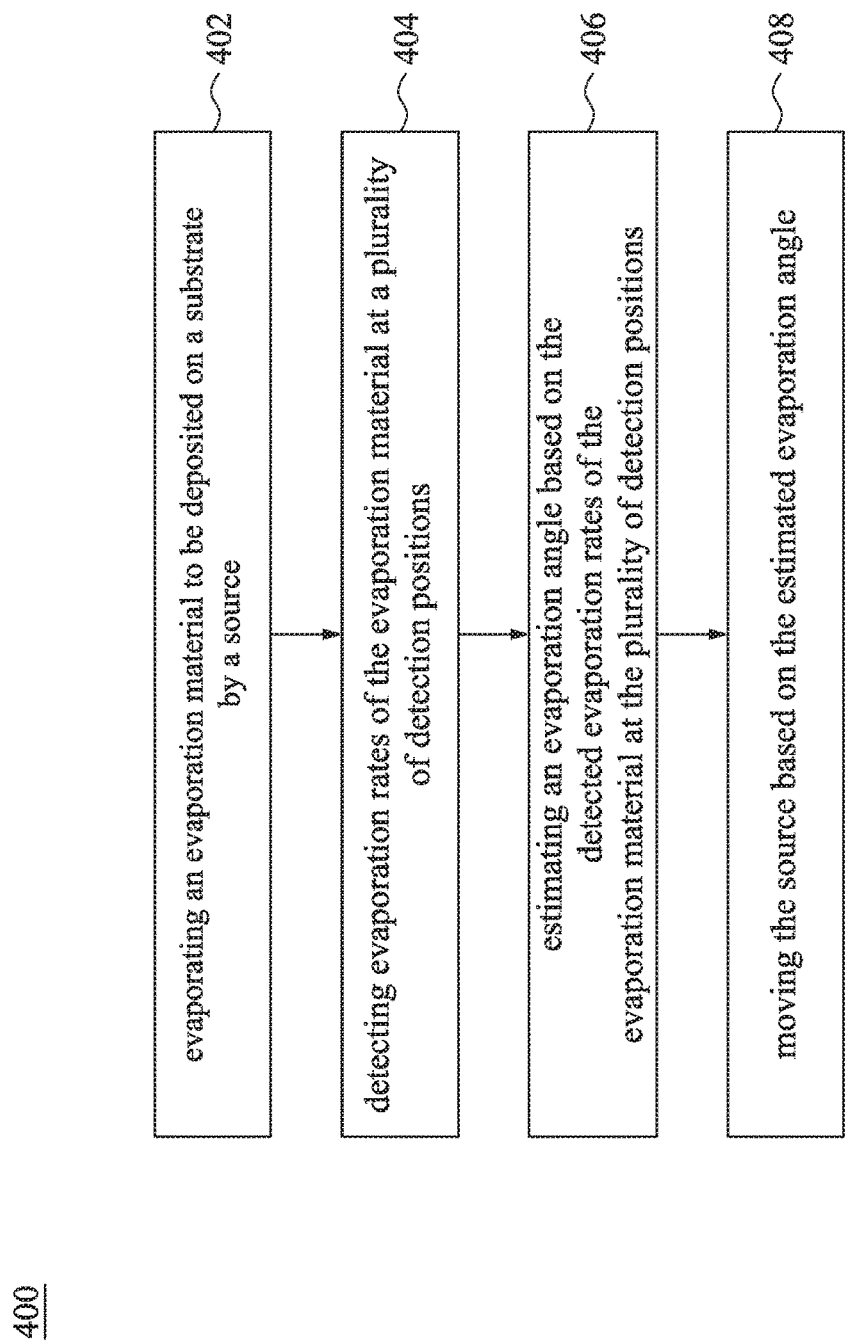
FIG. 2 is a flow chart of an evaporation method according to some embodiments of this disclosure.

FIG. 2 is a flow chart of an evaporation method 400 according to some embodiments of the present disclosure. The evaporation method 400 includes operations 402~408. The operations 402~408 may be illustrated in accompany with FIG. 1A.

First, reference is made to FIG. 1A and FIG. 2. The operation 402 is performed by evaporating an evaporation material 300 to be deposited on a substrate 200 by a source 120. As previously stated, the evaporation material 300 discharged from the opening 122a may spread at the evaporation angle Θ, which is desired to be known.

Then, the operation 404 is performed by detecting evaporation rates of the evaporation material 300 at a plurality of detection positions P. In these embodiments, the evaporation rates of the evaporation material 300 are detected at the detection positions P by the first sensor 130. In some embodiments, the detection positions P are arranged along a detection line L which is substantially straight. Herein, the detection line L extends substantially orthogonal to a surface 202 of the substrate 200 on which the evaporation material 300 is to be deposited. Through the configuration, the first sensor 130 receives the evaporation material 300 discharged at different directions at the detection positions P. Since the distribution of evaporation rates is related to the evaporation angle Θ, the evaporation angle Θ may be inferred from the detected evaporation rates at the detection positions P.

Figure 1C:
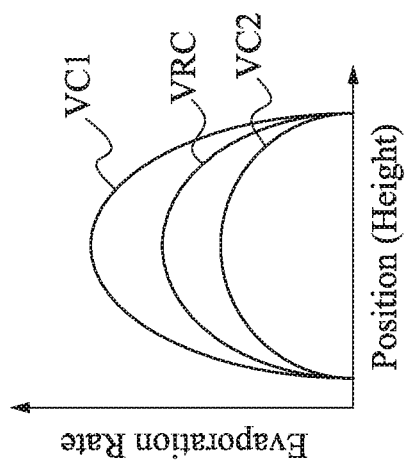
FIG. 1C is a diagram showing detection results of the evaporation rates with respect to the detection positions along a detection line of FIG. 1B.
Figure 1B:
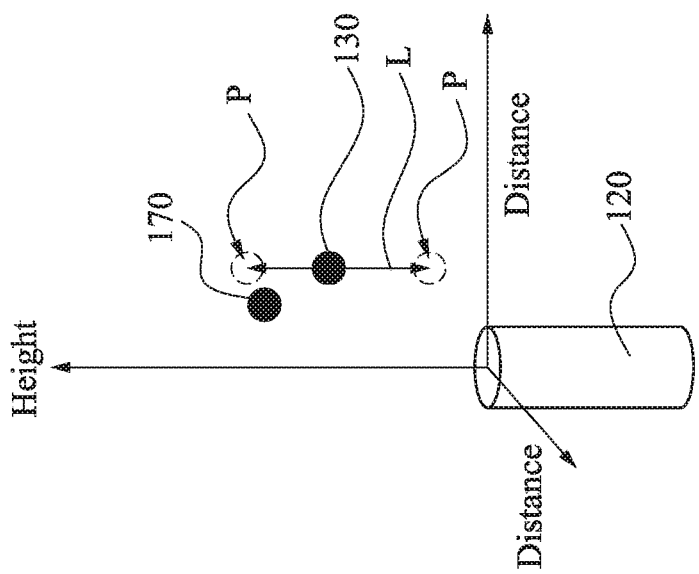
FIG. 1B is a diagram showing a detection line in a three-dimensional coordinate system of heights and horizontal distances according to the first embodiment.

Reference is made to both FIG. 1A and FIG. 1B. FIG. 1B is a diagram showing a detection line L in a three-dimensional coordinate system of the heights and the horizontal distances according to the first embodiment of the present disclosure.

Herein, the first sensor 130 is depicted in the figure and designed to move along the detection line L for receiving the evaporation material 300 discharged from the source 120 at different directions. In some embodiments, the second sensor 170 may be located adjacent to the detection line L. Alternatively, in some embodiments, the second sensor 170 may be located at any position that the evaporation material 300 is discharged to. The distribution of the evaporation rates has negative correlation with the horizontal distance between the detection positions P and the source 120, and may have a maximum value at a middle height.

Reference is made both to FIG. 1B and FIG. 1C. FIG. 1C is a diagram showing detection results of the evaporation rates with respect to the detection positions P, which are specifically referred to as the heights of the detection positions P along a detection line of FIG. 1B. When the first sensor 130 moves along the detection line L, a curve VC1 or a curve VC2 in FIG. 1C may be obtained. The curve VC1 illustrates the evaporation rates at the detection positions P at the first condition with the large evaporation angle, and the curve VC2 illustrates the evaporation rates at the detection positions P at the second condition with the small evaporation angle.

In one or more embodiments of the present disclosure, a curve VRC showing the reference evaporation rates at the detection positions P may be obtained first. The curve VRC may be a standard curve for the operation of the evaporation. The reference evaporation rates may be obtained by experiments or simulations. For example, a cycle of detection includes detecting an evaporation rate at each of the detection positions P. The cycle of the detection may be repeated many times, and therefore many detection results are obtained. The reference evaporation rates may be obtained by averaging part or all of the detection results at the detection positions P respectively.

In one or more embodiments of the present disclosure, the curve VC1, the curve VC2, and the curve VRC may be normalized or adjusted through math formulas such that two ends of the curve VC1 are adjusted to be respectively overlapped with two ends of the curve VC2 as well as two ends of the curve VRC.

Reference is made to FIG. 1A, FIG. 1C and FIG. 2. The operation 406 is performed by estimating the evaporation angle $\ominus$ based on the detected evaporation rates of the evaporation material 300 at the detection positions P.

In one or more embodiments of the present disclosure, the evaporation angle $\ominus$ may be assumed to have a positive correlation with the evaporation rates, and the calculating unit 140 includes a comparing unit 142 configured to compare the detected evaporation rates with reference evaporation rates respectively. In some embodiments, the evaporation angle $\ominus$ may be obtained from the evaporation rates. Alternatively, in some embodiments, it is not necessary to obtain the evaporation angle $\ominus$, but a relative relationship between the evaporation angle $\ominus$ and a reference evaporation angle (which is related to the reference evaporation rates) is developed and obtained.

In an embodiment, if the differences between the detected evaporation rates and the reference evaporation rates (the detected evaporation rates subtracted by the reference evaporation rates) are positive, the evaporation angle is considered to be greater than the reference evaporation angle. To be specific, if a sum of the differences between the detected evaporation rates and the reference evaporation rates (the detected evaporation rates subtracted by the reference evaporation rates) is positive, the evaporation angle is considered to be greater than the reference evaporation angle.

When comparing a sum of the detected evaporation rates with a sum of the reference evaporation rates, whichever having the greater value is considered to have a greater evaporation angle. Alternatively, in some embodiments, when comparing a sum of a range of the detected evaporation rates with a sum of a corresponding range of the reference evaporation rates, whichever having the greater value is considered to have a greater evaporation angle.

In another embodiment, instead of comparing the differences between the detected evaporation rates and the reference evaporation rates, a fitting method may be utilized for obtaining the value of the evaporation angle $\ominus$. A linear or a non-linear relationship between the reference evaporation angle $\ominus$ and the reference evaporation rates may be first obtained by using the fitting method. Then, the evaporation angle $\ominus$ may be obtained from the detected evaporation rates by the fitting equation.

In addition to the above comparison method and the fitting method, there are still a variety of mathematic skills or simulations for analyzing the detected evaporation rates and estimating the evaporation angle $\ominus$. For example, simulations related to thermodynamics and fluid mechanics may be adopted to estimate the flow rates and distribution of molecules in the space, such that the evaporation rates and the evaporation angle can be obtained. The exemplary estimating methods illustrated herein should not limit the scope of the present disclosure.

In this way, the estimated evaporation angle $\ominus$ may be obtained. Then, the operation 408 is performed by moving the source 120 based on the estimated evaporation angle $\ominus$. In some embodiments, in which the evaporation angle $\ominus$ is inferred from the differences between the detected evaporation rates and the reference evaporation rates respectively, the operation of moving the source may be performed based on the differences between the detected evaporation rates and the reference evaporation rates. To be specific, the actuator 150 is configured to move the source 120 based on differences between the detected evaporation rates and the reference evaporation rates.

At the first condition, as shown by the curve VC1 and the curve VRC, the detected evaporation rates are greater than the reference evaporation rates respectively, and thus it may be considered that the evaporation angle $\ominus$ is greater than the reference evaporation angle (evaporation angle of the curve VRC). In this way, the source 120 is designed to move closer to the substrate 200 in a direction orthogonal to the surface 202 of the substrate 200.

At the second condition, as shown by the curve VC2 and the curve VRC, the detected evaporation rates are smaller than the reference evaporation rates respectively, and thus it may be considered that the evaporation angle $\ominus$ is smaller than the reference evaporation angle. In this way, the source 120 is designed to move away from the substrate 200 in a direction orthogonal to the surface 202 of the substrate 200.

Accordingly, in one or more embodiments of the present disclosure, a relative position between the source 120 and the substrate 200 may be adjusted according to the estimated evaporation angle $\ominus$. When the estimated evaporation angle $\ominus$ is changed, the evaporation rates on the substrate 200 are adjusted to be similar to the reference evaporation rates. In this way, the substrate 200 may receive the evaporation material 300 uniformly.

Referring to FIG. 1A and FIG. 1B, in addition to the obstruction in the opening 122a of the crucible 122, various environmental factors, such as the environmental temperature, sometimes may also influence the evaporation during the above evaporation process. Herein, for ensuring that the evaporation apparatus 100 is performed at an ideal situation, the second sensor 170 is disposed at a predetermined position PP for detecting the working status of the evaporation apparatus 100.

In one or more embodiments, the second sensor 170 detects a monitoring evaporation rate of the evaporation material at the predetermined position PP. In this embodiment, the monitoring evaporation rate may be compared with a normal value. A temperature of the source 120 may be controlled based on the monitoring evaporation rate. For example, the temperature of the source 120 is increased when the monitoring evaporation rate decreases or is smaller than the normal value, and the temperature of the source 120 is decreased when the monitoring evaporation rate increases or is greater than the normal value. In this way, the working status of the evaporation apparatus 100 may be stable in the evaporation process.

Figure 3A:
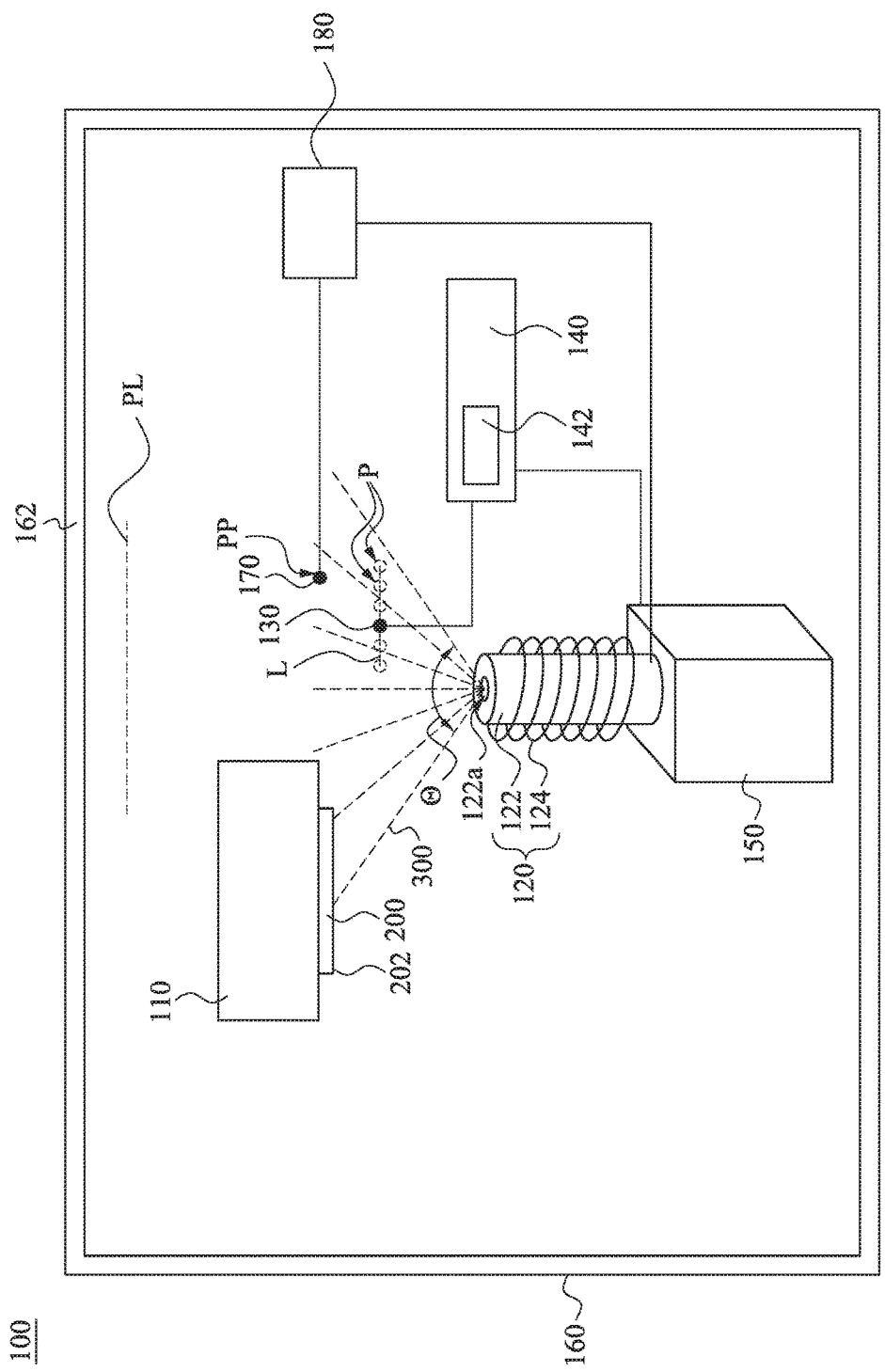
FIG. 3A is a schematic view of an evaporation apparatus according to a second embodiment of this disclosure.

FIG. 3A is a schematic view of an evaporation apparatus 100 according to a second embodiment of this disclosure. The present embodiment is similar to the first embodiment, and one of the differences is that: the detection line L extends substantially parallel with the surface 202 of the substrate 200, instead of being orthogonal to the surface 202 of the substrate 200. Another difference between the present embodiment and the first embodiment lies in the operation of moving the source 120. In the present embodiment, the source 120 moves in a direction parallel with the surface 202 of the substrate 200. Moreover, in some embodiments, the source 120 may moves in a direction orthogonal to the surface 202 of the substrate 200.

Figure 3C:
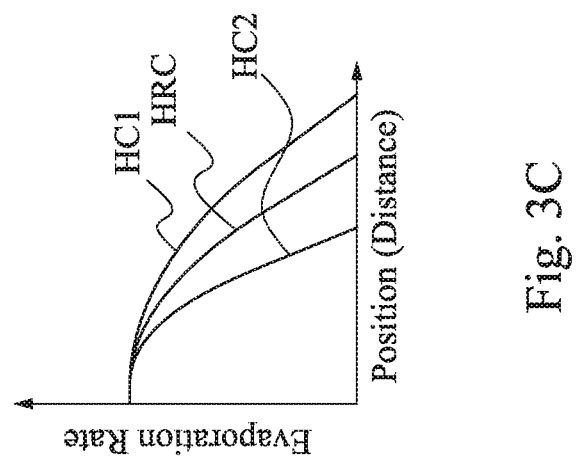
FIG. 3C is a diagram showing detection results of the evaporation rates with respect to the detection positions along a detection line of FIG. 3A.
Figure 3B:
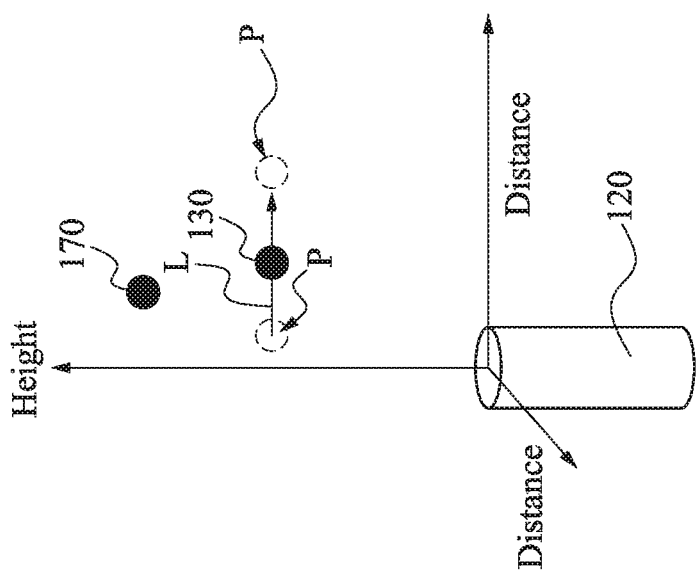
FIG. 3B is a diagram showing a detection line in a three-dimensional coordinate system of heights and horizontal distances according to the second embodiment of the present disclosure.

Reference is made to both FIG. 3A and FIG. 3B. FIG. 3B is a diagram showing a detection line L in a three-dimensional coordinate system of heights and horizontal distances according to the second embodiment of the present disclosure. The first sensor 130 may move horizontally along the detection line L. The first sensor 130 and the second sensor 170 are located in a range where the evaporation material 300 is discharged to.

Reference is made to FIG. 3B and FIG. 3C. FIG. 3C is a diagram showing detection results of the evaporation rates with respect to the detection positions P. The curve HC1 illustrates the evaporation rates at the detection positions P at the first condition with the large evaporation angle, and the curve HC2 illustrates the evaporation rates at the detection positions at the second condition with the small evaporation angle. The curve HRC shows the reference evaporation rates at the detection positions. It is shown that, when the detection positions P are aligned horizontally, the detected evaporation rates and the reference evaporation rates may have a greatest value close to the source 120 and a smallest value away from the source 120.

Though the greatest value of the curve HC1, curve HC2, and curve HRC are substantially the same in the figure, in an actual operation, the greatest value of the curve HC1, curve HC2, and the curve HRC may be slightly different. The curve HC1, curve HC2, and curve HRC may be normalized or processed through math formulas such that the curve HC1, curve HC2, and curve HRC have the same greatest value.

Reference is made to FIG. 3A and FIG. 3C. As illustrated in the first embodiments, since the first sensor 130 may detect the evaporation material 300 at different directions, the evaporation angle ϴ may be inferred from the evaporation rates. Herein, a reference evaporation angle may be inferred from the reference evaporation rates of the curve HRC. In some embodiments, the estimated evaporation angle ϴ may be compared to the reference evaporation angle. In some embodiments, it is not necessary to obtain the evaporation angle ϴ, but a relative relationship between the evaporation angle ϴ and a reference evaporation angle is developed and obtained. Based on the evaporation angle ϴ or the relative relationship between the evaporation angle ϴ and the reference evaporation angle, the source 120 may be moved.

At the first condition, as shown by the curve HC1 and the curve HRC, the detected evaporation rates are greater than the reference evaporation rates, and thus it is considered that the evaporation angle ϴ is greater than the reference evaporation angle (evaporation angle of the curve HRC). In this way, the source 120 is designed to move away from the substrate 200 in a direction parallel with the surface 202 of the substrate 200 for decreasing the evaporation rate.

At a second condition, as shown by the curve HC2 and the curve HRC, the detected evaporation rates are smaller than the reference evaporation rates, and thus it is considered that the evaporation angle ϴ is smaller than the reference evaporation angle. In this way, the source 120 may be moved closer to the substrate 200 in a direction parallel with the surface 202 of the substrate 200 for increasing the evaporation rates.

Other details of the present embodiment are similar to those of the first embodiment, and are not repeated herein.

Figure 4B:
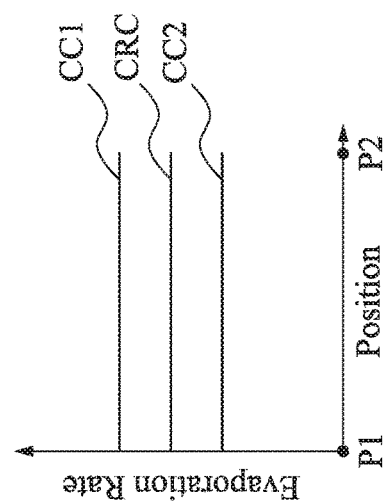
FIG. 4B is a diagram showing detection results of the evaporation rates with respect to the detection positions along the detection line of FIG. 4A.
Figure 4A:
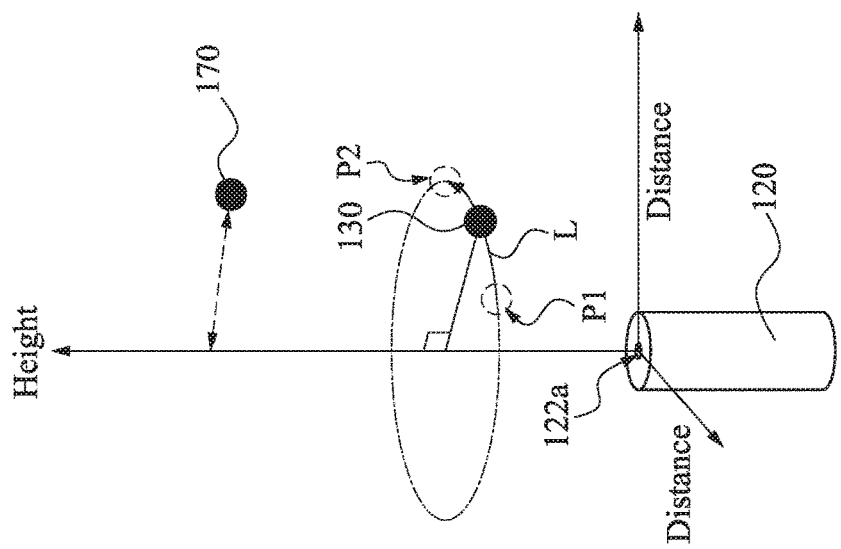
FIG. 4A is a diagram showing a detection line in a three-dimensional coordinate system of heights and horizontal distances according to a third embodiment of the present disclosure.

FIG. 4A is a diagram showing a detection line L in a three-dimensional coordinate system of heights and horizontal distances according to a third embodiment of the present disclosure. The detail configuration of the evaporation apparatus is omitted herein. The present embodiment is similar to the first embodiment, and the difference is that: the detection line L of the present embodiment is curved. Herein, the first sensor 130 moves curvedly from the first position P1 to the second position P2 along the detection line L, in which the first position P1 and the second position P2 may have substantially the same height and the same radius with respect to the extension line of the opening 122a of the source 120.

Reference is made to FIG. 4A and FIG. 4B. FIG. 4B is a diagram showing detection results of the evaporation rates with respect to the detection positions along the detection line L of FIG. 4A. The curve CC1 illustrates the evaporation rates with respect to the detection positions at the first condition with the large evaporation angle, and the curve CC2 illustrates the evaporation rates with respect to the detection positions at the second condition with the small evaporation angle. The curve CRC shows the reference evaporation rates with respect to the detection positions.

As illustrated in the first embodiments, in some embodiments, the evaporation angle ϴ (referring to FIG. 1A) may be estimated to have a relative relationship with the reference evaporation angle. In some embodiments, the evaporation angle ϴ (referring to FIG. 1A) may be obtained by the fitting method. Based on the estimated evaporation angle, the source 120 may be moved.

At the first condition, as shown by the curve CC1 and the curve CRC, the detected evaporation rates are greater than the reference evaporation rates, and thus it is considered that the evaporation angle ϴ (referring to FIG. 1A) is greater than the reference evaporation angle (evaporation angle of the curve CRC). The source 120 is designed to move horizontally away from the surface 202 of the substrate 200 (referring to FIG. 1A) or vertically closer to the surface 202 of the substrate 200 (referring to FIG. 1A).

At a second condition, as shown by the curve CC2 and the curve CRC, the detected evaporation rates are smaller than the reference evaporation rates, and thus it is considered that the evaporation angle ϴ (referring to FIG. 1A) is smaller than the reference evaporation angle (evaporation angle of the curve CRC). The source 120 is designed to move horizontally closer to the surface 202 of the substrate 200 (referring to FIG. 1A) or vertically away from the surface 202 of the substrate 200 (referring to FIG. 1A).

Other details of the present embodiment are similar to those of the first embodiment, and are not repeated herein.

Figure 5B:
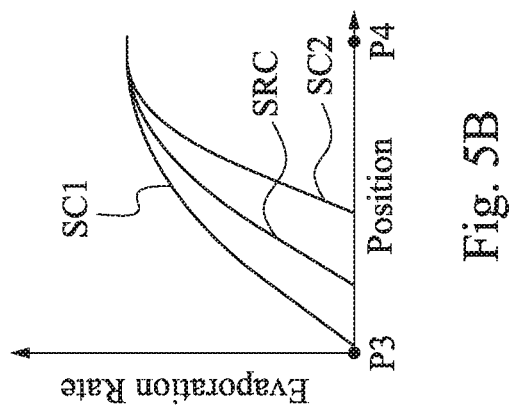
FIG. 5B is a diagram showing detection results of the evaporation rates with respect to detection positions along the detection line of FIG. 5A.
Figure 5A:
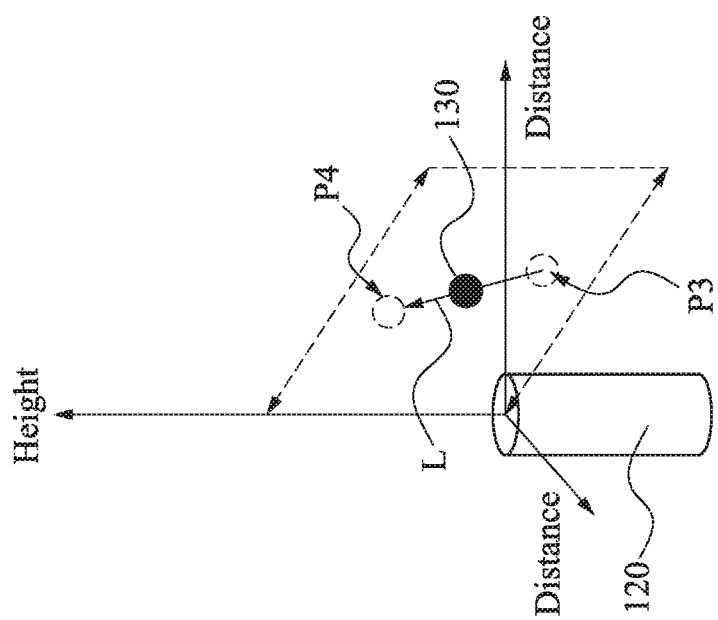
FIG. 5A a diagram showing a detection line in a three-dimensional coordinate system of heights and horizontal distances according to a fourth embodiment of the present disclosure.

FIG. 5A a diagram showing the detection line L in a three-dimensional coordinate system of heights and horizontal distances according to a fourth embodiment of the present disclosure. The present embodiment is similar to the first embodiment, and the difference is that: the detection line L slopes relative to a normal direction orthogonal to the surface 202 of the substrate 200 (referring to FIG. 1A) on which the evaporation material 300 (referring to FIG. 1A) is deposited.

Also, as illustrated in the first embodiments, the evaporation angle ⊖ (referring to FIG. 1A) may be estimated to have a relative relationship with the reference evaporation angle. In some embodiments, the evaporation angle ⊖ (referring to FIG. 1A) may be obtained by the fitting method. Based on the estimated evaporation angle, the source 120 may be moved vertically or horizontally.

FIG. 5B is a diagram showing detection results of the evaporation rates with respect to the detection positions along the detection line L of FIG. 5A. In this embodiment, the first sensor 130 moves along the detection L from the position P3 to the position P4.

The curve SC1 illustrates the evaporation rates with respect to the detection positions along the detection line L at the first condition with the large evaporation angle, and the curve SC2 illustrates the evaporation rates with respect to the detection positions along the detection line L at the second condition with the small evaporation angle. The curve SCR shows the reference evaporation rates with respect to the detection positions along the detection line L.

In one or embodiments of the present disclosure, the curve SC1, the curve SC2, and the curve SCR may be normalized or processed through some math formulas such that an end of the curve SC1, an end of the curve SC2, and an end of the curve SCR are overlapped.

At the first condition, as shown by the curve SC1 and the curve SRC, the detected evaporation rates are greater than the reference evaporation rates, and thus it is considered that the evaporation angle ⊖ is greater than the reference evaporation angle. In this way, the source 120 is designed to move horizontally away from the surface 202 of the substrate 200 or vertically closer to the surface 202 of the substrate 200 (referring to FIG. 1A).

At the second condition, as shown by the curve SC2 and the curve SRC, the detected evaporation rates are smaller than the reference evaporation rates, and thus it is considered that the evaporation angle ⊖ is smaller than the reference evaporation angle (evaporation angle of the curve SRC). In this way, the source 120 may be moved horizontally closer to the surface 202 of the substrate 200 or vertically away from the surface 202 of the substrate 200 (referring to FIG. 1A).

Other details of the present embodiment are similar to the first embodiment, and thereto not repeated herein.

It may be appreciated that, depending on the detection line, there are a variety of sets of the detected evaporation rates and the reference evaporation rates. One of ordinary skill in the art may design the detection line for obtaining the detected evaporation rates carrying information about the evaporation angle.

In one or more embodiments, the evaporation angle in the evaporation process is estimated from the detected evaporation rates at detection positions, and the source is moved according to the evaporation angle. In this way, although the evaporation angle may be changed, film thickness uniformity of the evaporation material on the substrate can substantially be maintained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An evaporation apparatus, comprising:
   a holder configured to hold a substrate;
   a source configured to evaporate an evaporation material which is to be deposited on the substrate;
   a first sensor configured to detect evaporation rates of the evaporation material at a plurality of detection positions,
   wherein the plurality of detection positions are arranged along a detection line, and the detection line extends substantially orthogonal to a surface of the substrate on which the evaporation material is to be deposited,
   and wherein the source has an opening from which the evaporation material is discharged, and a projection of the detection line on a projection plane is separated from a projection of the opening of the source on the projection plane, wherein the projection plane is substantially parallel with the surface of the substrate;
   a calculator unit configured to estimate an evaporation angle based on the detected evaporation rates of the evaporation material at the plurality of detection positions; and
   an actuator configured to move the source based on the estimated evaporation angle.

2. The evaporation apparatus of claim 1, wherein the first sensor is movable along the detection line.

3. The evaporation apparatus of claim 1, wherein the detection line is substantially straight.

4. The evaporation apparatus of claim 1, wherein the detection line slopes relative to a normal direction orthogonal to the surface of the substrate on which the evaporation material is to be deposited.

5. The evaporation apparatus of claim 1, further comprising:
   a chamber configured to accommodate the holder, the source, and the first sensor, wherein the holder is proximate to a wall of the chamber, and the plurality of detection positions are located between the source and the wall of the chamber.

6. The evaporation apparatus of claim 1, wherein the calculator unit comprises:
   a comparator unit configured to compare the detected evaporation rates with reference evaporation rates respectively, wherein the actuator is configured to move the source based on differences between the detected evaporation rates and the reference evaporation rates.

7. The evaporation apparatus of claim 1, further comprising:
   a second sensor configured to detect a monitoring evaporation rate of the evaporation material at a predetermined position; and
   a controller unit configured to control a temperature of the source based on the monitoring evaporation rate.

8. The evaporation apparatus of claim 1, wherein the source is movable along a direction substantially orthogonal to the surface of the substrate on which the evaporation material is to be deposited.

9. The evaporation apparatus of claim 1, wherein the source is movable along a direction substantially parallel with the surface of the substrate on which the evaporation material is to be deposited.

10. An evaporation method using the evaporation apparatus of claim 1, comprising:

evaporating the evaporation material to be deposited on the substrate by the source;

detecting evaporation rates of the evaporation material at the plurality of detection positions, wherein the plurality of detection positions are arranged along the detection line, and the detection line extends substantially orthogonal to the surface of the substrate on which the evaporation material is deposited;

estimating the evaporation angle based on the detected evaporation rates of the evaporation material at the plurality of detection positions; and moving the source based on the estimated evaporation angle.

11. The evaporation method of claim 10, wherein the source has the opening from which the evaporation material is discharged, and the projection of the detection line on the projection plane is separated from the projection of the opening of the source on the projection plane, wherein the projection plane is substantially parallel with the surface of the substrate.

12. The evaporation method of claim 10, wherein the evaporation rates of the evaporation material at the plurality of detection positions is detected by the first sensor; and the operation of detecting the evaporation rates of the evaporation material at the plurality of detection positions comprises moving the first sensor along the detection line.

13. The evaporation method of claim 10, wherein the operation of estimating the evaporation angle comprises comparing the detected evaporation rates with reference evaporation rates respectively, and the operation of moving the source is based on differences between the detected evaporation rates and the reference evaporation rates.

14. The evaporation method of claim 13, wherein the operation of moving the source comprises:

moving the source closer to the substrate in a direction orthogonal to the surface of the substrate on which the evaporation material is deposited when the detected evaporation rates are greater than the reference evaporation rates respectively.

15. The evaporation method of claim 13, wherein the operation of moving the source comprises:

moving the source away from the substrate in a direction orthogonal to the surface of the substrate on which the evaporation material is deposited when the detected evaporation rates are smaller than the reference evaporation rates respectively.

16. The evaporation method of claim 13, wherein the operation of moving the source comprises:

moving the source away from the substrate in a direction parallel with the surface of the substrate on which the evaporation material is deposited when the detected evaporation rates are greater than the reference evaporation rates respectively.

17. The evaporation method of claim 13, wherein the operation of moving the source comprises:

moving the source closer to the substrate in a direction parallel with the surface of the substrate on which the evaporation material is deposited when the detected evaporation rates are smaller than the reference evaporation rates respectively.

18. The evaporation method of claim 10, wherein the operation of moving the source comprises:

moving the source closer to the substrate in a direction orthogonal to the surface of the substrate on which the evaporation material is deposited when the evaporation angle is greater than a reference evaporation angle.

19. The evaporation method of claim 10, wherein the operation of moving the source comprises:

moving the source away from the substrate in a direction orthogonal to the surface of the substrate on which the evaporation material is deposited when the evaporation angle is smaller than a reference evaporation angle.

20. The evaporation method of claim 10, wherein the operation of moving the source comprises:

moving the source away from the substrate in a direction parallel with the surface of the substrate on which the evaporation material is deposited when the evaporation angle is greater than a reference evaporation angle.

21. The evaporation method of claim 10, wherein the operation of moving the source comprises:

moving the source closer to the substrate in a direction parallel with the surface of the substrate on which the evaporation material is deposited when the evaporation angle is smaller than a reference evaporation angle.

22. The evaporation method of claim 10, further comprising:

detecting a monitoring evaporation rate of the evaporation material at a predetermined position; and controlling a temperature of the source based on the monitoring evaporation rate.

23. The evaporation method of claim 22, the operation of controlling the temperature of the source further comprising:

increasing the temperature of the source when the monitoring evaporation rate decreases.

24. The evaporation method of claim 22, the operation of controlling the temperature of the source further comprising:

decreasing the temperature of the source when the monitoring evaporation rate increases.

* * * * *